(12) United States Patent
Maindron et al.

(10) Patent No.: US 9,224,621 B2
(45) Date of Patent: Dec. 29, 2015

(54) ENCAPSULATION PROCESS AND ASSOCIATED DEVICE

(71) Applicant: COMMISSARIAT A L'ENERGIE ATOMIQUE ET AUX ENE ALT, Paris (FR)

(72) Inventors: Tony Maindron, Grenoble (FR); Nicolas Troc, Troyes (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 14/217,670

(22) Filed: Mar. 18, 2014

(65) Prior Publication Data

US 2014/0284807 A1    Sep. 25, 2014

(30) Foreign Application Priority Data

Mar. 21, 2013 (FR) ...................... 13 52533

(51) Int. Cl.
| | | |
|---|---|---|
| H01L 23/48 | (2006.01) |
| H01L 23/52 | (2006.01) |
| H01L 21/56 | (2006.01) |
| H01L 51/52 | (2006.01) |
| H01L 29/66 | (2006.01) |
| H01L 29/786 | (2006.01) |

(Continued)

(52) U.S. Cl.
CPC .......... *H01L 21/56* (2013.01); *H01L 29/66742* (2013.01); *H01L 29/786* (2013.01); *H01L 31/0203* (2013.01); *H01L 31/18* (2013.01); *H01L 51/0001* (2013.01); *H01L 51/5203* (2013.01); *H01L 51/5253* (2013.01); *H01L 51/56* (2013.01); *H01L 27/3276* (2013.01);

(Continued)

(58) Field of Classification Search
CPC ... H01L 21/56; H01L 31/18; H01L 29/66742; H01L 31/0203; H01L 51/0001; H01L 51/56; H01L 27/786; H01L 51/5253; H01L 51/5203; H01L 51/107; H01L 51/448; H01L 51/5237; H01L 27/3288; H01L 27/3276
See application file for complete search history.

(56) References Cited

U.S. PATENT DOCUMENTS 5,913,147 A * 6/1999 Dubin et al. .................. 438/687
6,268,071 B1    7/2001 Yasukawa et al.
(Continued)

FOREIGN PATENT DOCUMENTS

EP    0 899 987 A1    3/1999
FR    2 958 795 A1    10/2011
(Continued)

OTHER PUBLICATIONS

French Preliminary Search Report issued Dec. 19, 2013 in French Application 13 52533, filed on Mar. 21, 2013 (with English Translation of Categories of Cited Documents).

*Primary Examiner* — Jarrett Stark
(74) *Attorney, Agent, or Firm* — Oblon, McClelland, Maier & Neustadt, L.L.P.

(57) ABSTRACT

The invention relates to an encapsulation process for an electronic component (2). The component (2) is connected to an electrical contact track composed of a metal layer (101).
The process according to the invention comprises the following steps:
  deposition of a titanium nitride layer (102) directly on at least part of the electrical contact track (101); and
  deposition of an aluminum oxide layer (4) by atomic layer deposition, such that the encapsulation layer (4) directly covers the titanium nitride layer (102).
The process according to the invention enables electrical contact through the encapsulation layer (4).
The invention also relates to an electronic device obtained using such a process.

8 Claims, 2 Drawing Sheets

(51) Int. Cl.
  H01L 31/0203 (2014.01)
  H01L 31/18 (2006.01)
  H01L 51/00 (2006.01)
  H01L 51/56 (2006.01)
  H01L 27/32 (2006.01)
  H01L 51/44 (2006.01)
  H01L 51/10 (2006.01)

(52) U.S. Cl.
  CPC ........... *H01L27/3288* (2013.01); *H01L 51/107* (2013.01); *H01L 51/448* (2013.01); *H01L 51/5237* (2013.01)

(56) References Cited

U.S. PATENT DOCUMENTS

| | | |
|---|---|---|
| 6,552,488 B1 | 4/2003 | Roitman et al. |
| 6,583,507 B1 * | 6/2003 | Moon et al. .................... 257/751 |
| 7,745,340 B2 | 6/2010 | Ghosh et al. |
| 8,698,396 B2 | 4/2014 | Maindron et al. |
| 2003/0143319 A1 | 7/2003 | Park et al. |
| 2005/0248270 A1 * | 11/2005 | Ghosh et al. .................. 313/512 |
| 2006/0051951 A1 | 3/2006 | Ghosh et al. |
| 2010/0006989 A1 * | 1/2010 | Dalal et al. .................... 257/659 |
| 2011/0049591 A1 * | 3/2011 | Nakatani et al. .............. 257/292 |
| 2013/0099658 A1 * | 4/2013 | Tsai et al. ..................... 313/504 |

FOREIGN PATENT DOCUMENTS

| | | |
|---|---|---|
| JP | 2002-373777 | 12/2002 |
| JP | 2002-373777 A | 12/2002 |
| JP | 2003-208975 | 7/2003 |
| JP | 2003-208975 A | 7/2003 |

* cited by examiner

ENCAPSULATION PROCESS AND ASSOCIATED DEVICE

TECHNICAL FIELD

This invention relates to the field of encapsulation of electronic components, particularly opto-electronic components. The invention also relates to the field of electronic devices comprising such a component.

STATE OF PRIOR ART

Some electronic components have to be kept under a controlled atmosphere for them to function correctly. For example this is the case for opto-electronic components such as Organic Light Emitting Diodes (OLEDs). This is achieved by hermetically enclosing or encapsulating these components inside a cavity with a controlled atmosphere (in particular, control of the nature of the gas and the pressure inside the cavity).

The component is conventionally made by depositing layers on a support (or substrate) and is covered by a cover. The cover and the substrate jointly form the required hermetically sealed cavity. This cover is sometimes called the "encapsulation structure". It is usually made by depositing at least one thin layer called the encapsulation layer, covering the component and surrounding its sides.

The component is connected to at least one electrical contact track, said track conducting electricity and enabling to provide electrical power supply to the component, to recover signals generated by said component, and also to control functions contained in it. The electrical contact track is typically formed on the substrate. An electrical contact track typically extends entirely and directly on the substrate.

The encapsulation layers are electrical insulators.

Therefore during encapsulation of the component, the question arises about how to protect the electrical contact tracks, to prevent them from being covered by an encapsulation layer.

The difficulty is due to the fact that usual encapsulation techniques do not enable a local deposition of an encapsulation layer. Thus, the electrical contact tracks are covered by the encapsulation layer.

This is the case particularly during a Chemical Vapor Deposition (CVD) and particularly for a Plasma Enhanced CVD (PECVD) or an Atomic Layer Deposition (ALD). CVD refers to a vacuum deposition method for thin films starting from gas precursors. CVD has the advantage that it protects the integrity of fragile components, and particularly organic components. It is therefore preferred to other deposition techniques such as Physical Vapor Deposition (PVD) which can be used for a local deposition but which damages the component to be encapsulated.

Prior art includes different techniques for protecting electrical contact tracks.

For example, processes are known for locally eliminating the encapsulation layer, so as to expose electrical contact tracks. Such a process is disclosed in document US 2006/0051951 that discloses ablation by exposure to laser radiation. This document discloses a particular stack of layers above the electric contact tracks to make the ablation efficient, but this makes the process particularly long and complex.

One purpose of this invention is to disclose a process for encapsulation and an electronic device, to electrically connect an encapsulated component without any of the disadvantages of prior art.

In particular, one objective of this invention is to disclose a simple and efficient process for electrically connecting an encapsulated component.

PRESENTATION OF THE INVENTION

This invention is defined by a process for encapsulation of at least one electronic component, said component being connected to at least one electrical contact track composed of a metal layer, the process comprising a step to deposit an aluminium oxide encapsulation layer by atomic layer deposition.

According to the invention:
the process also comprises a step to deposit a titanium nitride layer on at least part of the electrical contact track; and
the encapsulation layer is deposited such that said encapsulation layer covers the titanium nitride layer.

In other words, the titanium nitride layer is deposited directly on at least part of the electrical contact track, and the encapsulation layer is then deposited particularly on the titanium nitride layer. The portion of the encapsulation layer deposited on the titanium nitride layer is deposited on it directly.

Advantageously, the encapsulation layer is then in direct contact with the titanium nitride layer in the entire zone located above the electrical contact track. Similarly, the titanium nitride layer is advantageously in direct contact with the electrical contract track over its entire surface.

The titanium nitride layer may be entirely covered by a portion of the encapsulation layer.

The titanium nitride layer can be deposited on at least part of the electrical contact track by physical vapor deposition.

Advantageously, the titanium nitride layer is deposited on at least part of the electrical contact track during a manufacturing step of the component, the component being manufactured by successive depositions of layers, of which at least one is a titanium nitride layer.

The process according to the invention may include a step to establish electrical contact with the at least part of the electrical contact track, using an electrical contact element deposited on the encapsulation layer. The electrical contact element is for example a contact point or wire deposited on the encapsulation layer. Thus, electrical contact is made between the electrical contact track and the electrical contact element (connected to an electrical power supply source) through the titanium nitride layer and the encapsulation layer.

The invention also relates to an electronic device comprising:
at least one electronic component;
an aluminium oxide encapsulation layer, deposited by atomic layer deposition, covering the component; and
at least one electrical contact track connected to the component and composed of a metal layer.

According to the invention, at least part of the electrical contact track is covered with a layer of titanium nitride, itself covered with said encapsulation layer.

In other words, the encapsulation layer is deposited particularly on the titanium nitride layer, and the titanium nitride layer is deposited directly on the at least part of the electrical contact track. The portion of encapsulation layer deposited on the titanium nitride layer is deposited directly on this titanium nitride layer.

The encapsulation layer may form an external surface of the device. In particular, the encapsulation layer may form an external surface of the device, in the zone located above the electrical contact track.

Preferably, the metal layer is a layer of an aluminium and copper alloy.

Alternatively, the metal layer may be a copper layer or an aluminium layer or a chromium layer.

The encapsulation layer is advantageously between 20 nm and 200 nm thick.

The titanium nitride layer is advantageously between 5 nm and 250 nm thick.

The component may be an inorganic solar cell, an OLED, an OPV or a micro-electronic component such as a transistor.

According to one advantageous embodiment, the device according to the invention also comprises an electrical contact element wired on the encapsulation layer and arranged to carry a current to the electrical contact track.

BRIEF DESCRIPTION OF THE DRAWINGS

This invention will be better understood after reading the description of example embodiments given purely for information and in no way limitative with reference to the appended drawings among which.

DETAILED PRESENTATION OF PARTICULAR EMBODIMENTS

The basic idea of the invention is to demonstrate electrical conduction of a particular stack of layers.

Figure 1:
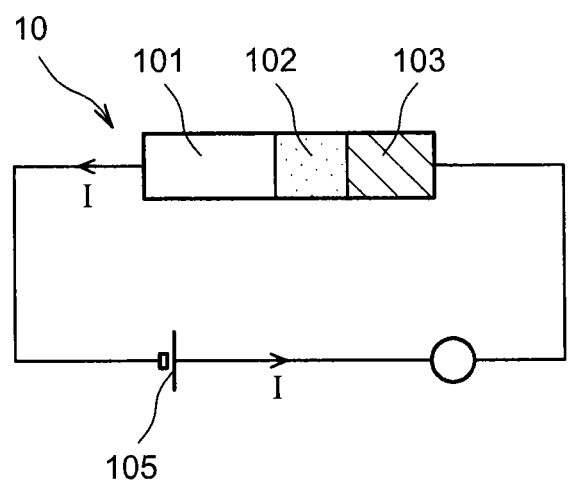
FIG. 1 shows the basic principle of the invention.

This property is shown diagrammatically in FIG. 1 showing a stack 10 to which an electrical voltage is applied by a generator 105.

The stack 10 comprises:
- a metal layer 101;
- a titanium nitride (TiN) layer 102 deposited on the metal layer 101; and
- an aluminium oxide ($Al_2O_3$) layer 103 deposited by Atomic Layer Deposition (ALD) on the titanium nitride layer 102.

Note that the term "deposition of a first layer on a second layer" means that the first layer is deposited directly on the second layer. In other words, after the deposition, the first layer is in direct contact with the second layer. It can also be said that the first layer covers the second layer, or even that the first layer directly covers the second layer. Deposition of a first layer on a second layer implies that there is no intermediate layer between the first and second layers.

Incorporation of the titanium nitride layer 102 between the metal layer 101 and the aluminium oxide (alumina) layer 103 enables establishment of the electrical contact through the aluminium oxide layer 103, particularly by means of a point or by usual wire bonding techniques.

As a reminder, note that the ALD technique is a special case of CVD which consists of exposing a surface to different chemical precursors one after the other during predetermined time intervals (deposition cycles) in order to obtain ultra-thin layers. ALD uses at least one cycle for deposition of an ultra-thin monolayer on a surface. The chemical precursors react during each cycle so as to eventually cover the surface with a layer that, depending on the application, may be ultra-thin (typically the monolayer or between 1 nm and 30 nm thick) or thicker (for example up to 100 nm, or between 25 nm and 50 nm). The number of cycles can be varied to obtain a required thickness on the surface.

One particularly advantageous application of this property applies to the field of encapsulation of electronic components, particularly opto-electronic components, and particularly when these components comprise an organic active layer.

Due to a judicious choice of the encapsulation layer (aluminium oxide deposited by ALD), and by inserting a layer of titanium nitride between the metallic electrical contact track and the encapsulation layer, an electrical contact is authorised on the electrical contact track through the encapsulation layer. In particular, an electrical current can pass through the encapsulation layer to reach the electrical contact track.

The result obtained is thus an encapsulation that enables to electrically connect the encapsulated components, and that comprises only a small number of steps. The process according to the invention is very easy to implement. In particular, no masking or photolithography and etching step is necessary, nor is there any need for partial ablation. Furthermore, the electronic device according to the invention has excellent mechanical stability since the encapsulation layer is not open at the electrical contact tracks.

It can also be noted that in many cases, the usual encapsulation process covers the electrical contact tracks with a layer of an aluminium oxide. For example this would be the case if an encapsulation process called SHB (Super High Barrier) is used like that disclosed for example in patent application FR2958795. According to this process, a component is efficiently protected by means of a three-layer stack made of an oxide layer, an organic polymer layer and an external aluminium oxide layer deposited by ALD. In such cases, application of the process according to the invention will only require the addition of an intermediate titanium nitride layer.

Another advantage of the invention is that the aluminium oxide layer above the electrical contact tracks protects them against environmental aggression (particularly by preventing corrosion), which increases the life of the electronic device.

Several embodiments of the electronic devices according to the invention will be described later. The description of electronic devices will also illustrate the process according to the invention.

Figure 2:
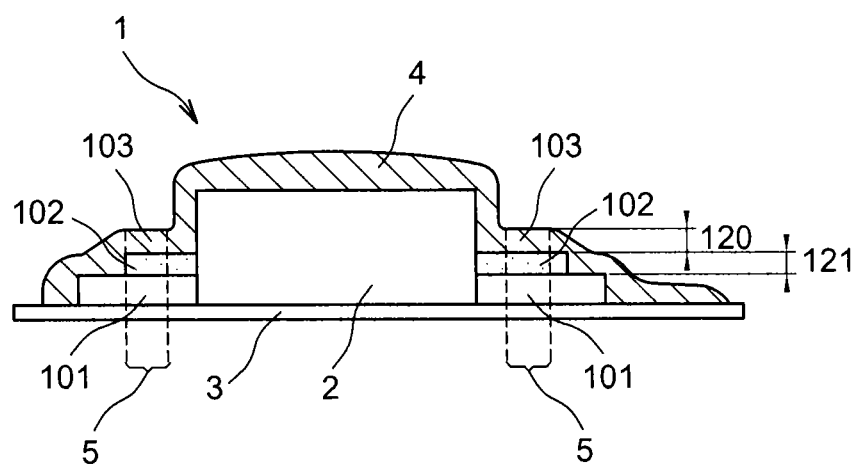
FIG. 2 shows a first embodiment of an electronic device according to the invention.

FIG. 2 shows a first embodiment of an electronic device 1 according to the invention.

According to this embodiment, an electronic or opto-electronic component 2 made on a substrate 3 is encapsulated by an encapsulation cover composed of a single encapsulation layer 4.

The encapsulation layer 4 is formed from a thin layer of aluminium oxide deposited by ALD.

In practice, it can be recognised that aluminium oxide was deposited by ALD because it usually has a dense and non-columnar microstructure. This microstructure may be observed by Transmission Electron Microscopy (TEM) coupled with Energy Dispersive X-ray spectrometry (EDX). Comparing the microstructure of an $Al_2O_3$ deposition by ALD and by PVD as seen in a sectional view, the first case results in a homogenous structure while in the second case there are oval stains partially superposed above each other.

The component 2 has two electrical contact tracks each composed of a metal layer 101 on the substrate 3, in direct contact with the component 2. These electrical contact tracks are dedicated to making the electrical connection of the component 2 and enable in particular to connect it to addressing electronics located outside the encapsulation cover. During deposition of the encapsulation layer on and around the component 2 according to prior art, these electrical contact tracks are covered by aluminium oxide.

According to the invention, a titanium nitride layer 102 is deposited directly on the metal layer 101 forming the electrical contact track, before the component 2 and the assembly formed by the electrical contact tracks and the corresponding titanium nitride layers are covered by the encapsulation layer 4.

The part of the encapsulation layer located above the metallic electrical contact track forms an aluminium oxide layer 103 as shown with reference to FIG. 1. Thus, a stack 10 like that described with reference to FIG. 1 is made in zone 5 of the electronic device 1.

The electronic device 1 according to the invention thus enables to establish an electrical contact through the aluminium oxide layer. In other words, the electronic device 1 according to the invention thus enables to restore an electrical contact through the aluminium oxide layer. The electrical connection of the component 2 can then be made with the metallic electrical contact tracks 101, directly after deposition of the encapsulation layer 4. The electrical connection of the component 2 may for example use wire bonding. A contact wire (not shown) for example made of aluminium, is deposited and welded on the encapsulation layer 4, above the metal layer 101. The process according to the invention may include this step to wire an electrical contact element directly on the encapsulation layer.

The titanium nitride layer 102 is typically deposited by Physical Vapor Deposition (PVD). A PVD deposits a thin layer on a surface by condensation of a material in the gas phase on said surface.

One advantage of using such a deposition type is that the layer may be locally deposited more easily at the electrical contact track only, by the use of shadow masks.

In some cases, electrical contact tracks can also be made by PVD of a metal layer 101 on a substrate such as tin-doped indium oxide (ITO).

The thickness 120 of the encapsulation layer 4 is typically between 20 nm and 200 nm, for example 50 nm or 100 nm. Preferably, this thickness is between 25 nm and 120 nm.

Such thicknesses can for example be used to make encapsulation layers providing excellent seal and long life. It has been observed that with such thicknesses, it was always possible to restore electrical contact through the encapsulation layer.

The thickness 121 of the titanium nitride layer 102 is between 5 nm and 250 nm, for example 7 nm, 25 nm, 50 nm or 100 nm. This thickness is preferably between 25 nm and 120 nm.

Therefore it can be seen that even small thicknesses of titanium nitride can give the required electrical conduction effect.

The metal layer 101 is for example an aluminium and copper alloy AlCu. Typically, the copper content of the alloy is between 1% and 2%.

Other metals, for example aluminium, chromium or copper could also be envisaged.

Several series of experiments have been made in the laboratory showing that a stack 10 according to the invention can give an electrical contact between a test point and the metal layer 101 forming an electrical contact track. This electrical contact can be made using a so-called soft point, in other words a point that does not penetrate into the aluminium oxide layer. For example a soft point can be made of beryllium copper alloy.

For example, the following stacks have been made:
200 nm of aluminium deposited by electron beam evaporation;
100 nm of titanium nitride deposited by magnetron sputtering at ambient temperature;
25 nm of aluminium oxide deposited by ALD at a temperature of 85° C., and in one variant at 250° C.

Such stacks give negligible contact resistance and enable electrical contact between a soft point and the aluminium layer.

The following stack was also made:
chromium deposited by electron beam evaporation;
titanium nitride deposited by electron beam evaporation;
25 nm of aluminium oxide deposited by ALD at a temperature of 85° C.

Such a stack give a contact resistance of 13Ω and enables electrical contact between a soft point and the chromium layer.

The following stack was also made:
200 nm of AlCu alloy deposited by magnetron sputtering on 5 nm of titanium nitride;
7 nm of titanium nitride deposited by magnetron sputtering;
25 nm or 50 nm of aluminium oxide deposited by ALD at a temperature of 85° C.

Such a stack give a negligible contact resistance and enables an electrical contact between a soft point and the AlCu alloy layer.

The following stack was also made:
100 nm of chromium deposited by electron beam evaporation;
30 nm of titanium nitride deposited by magnetron sputtering;
25 nm of aluminium oxide deposited by ALD at a temperature of 85° C.

Such a stack give a contact resistance of 29Ω and enables electrical contact between a soft point and the chromium layer.

If the aluminium oxide layer is replaced by another oxide such as silicon oxide SiOx, the electrical contact with a soft point is lost. The same applies if the titanium nitride intermediate layer is eliminated.

For example, the ALD is made at a temperature of less than 100° C., and particularly less than 85° C. However, other temperature ranges could be envisaged. In particular, it can be seen that a deposition at 250° C. always gives the required effect.

The component 2 is a device sensitive to the atmosphere. It may at least be one component from among:
an organic device such as an Organic Thin Film Transistor (OTFT), an organic photovoltaic (OPV) device or an OLED constructed on a flexible support;
a micro-display formed by an organic display (particularly an OLED) constructed on a CMOS (Complementary Metal Oxide Semiconductor) circuit;
an inorganic solar cell, for example based on zinc oxide (ZnO);
a micro-electronic device such as a transistor using transparent oxides sensitive to the environment (transistor TFT, or "Thin-Film Transistor", comprising INZO (Indium Gallium Zinc Oxide));
a PCB (Printed Circuit Board).

In particular, these components may require protection by an SHB process. In other words, encapsulation has to be done using an aluminium oxide layer deposited by ALD.

Figure 3:
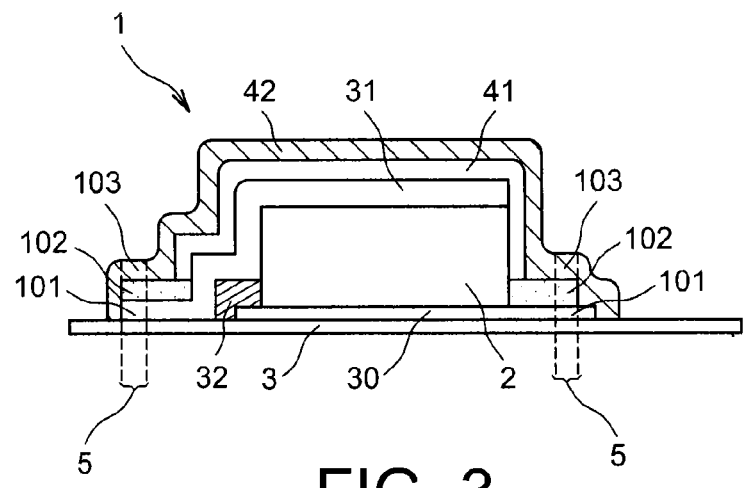
FIG. 3 shows a second embodiment of an electronic device according to the invention.

We will now describe a second embodiment of the electronic device 1 according to the invention with reference to FIG. 3. Only the differences between FIG. 3 and FIG. 2 will be described.

In FIG. 3, each electrical contact track 101 is formed by an edge of a metal layer belonging to the component 2. In particular, the component 2 is formed by a stack of layers, of which a first metal layer 30 forms the anode and a second metal layer 31 forms the cathode, one edge of the first metal layer forming a first electrical contact track and one edge of the second metal layer forming a second electrical contact track.

The first metal layer 30 forms a lower layer of the component 2, on the substrate side 3. The second metal layer 31 forms an upper layer of the component 2, on the side opposite the substrate 3.

In the embodiment shown in FIG. 3, an insulator 32 electrically isolates the metal layers 30 and 31.

The component 2 is covered by an encapsulation cover comprising several layers 41, 42. The outermost encapsulation layer (on the side of the cover opposite to the component 2) is an aluminium oxide layer deposited by ALD. This final layer 42 forms the encapsulation layer according to the invention. Only the encapsulation layer 42 covers the assembly composed of the electrical contact tracks, itself covered only by a respective layer of titanium nitride 102. Many variants could be imagined, in which the encapsulation cover is composed of a stack of several layers. In all cases, it will be checked that only the titanium nitride and aluminium oxide stack covers the contact tracks.

Figure 4:
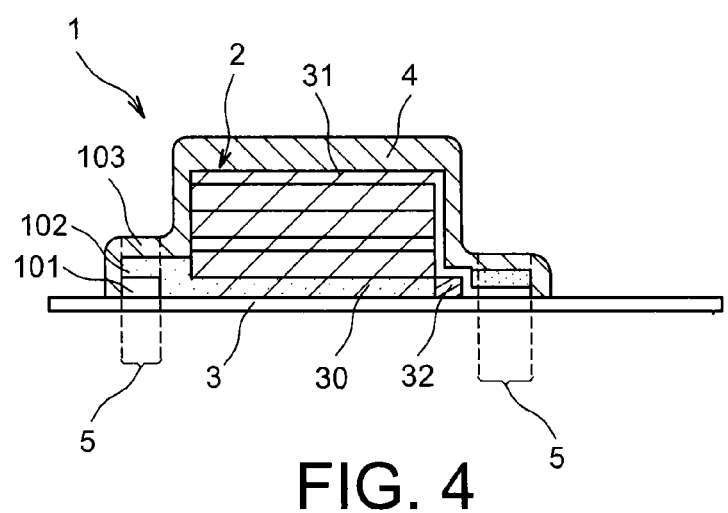
FIG. 4 shows a third embodiment of an electronic device according to the invention.

We will now describe a third embodiment of an electronic device 1 according to the invention with reference to FIG. 4. Only the differences between FIG. 4 and FIG. 3 will be described.

In this embodiment, the encapsulation cover is composed only of the monolayer of aluminium oxide, deposited by ALD and forming the encapsulation layer 4 according to the invention.

The component 2 is shown cross-hatched between the substrate 3 and the encapsulation layer 4.

The component 2 is made by successive depositions of thin layers. One of the thin layers forming the component 2 is a titanium nitride layer.

On one of the electrical contact tracks, the titanium nitride layer 102 is made simply by prolonging the titanium nitride layer forming part of the component 2.

In the particular example shown in FIG. 4, this titanium nitride layer forms the anode 30 of the component 2 that is then prolonged to extend on a metallic electrical track.

Therefore the titanium nitride layer deposited on this electrical contact track is simply the extension of one of the layers forming the component 2. This embodiment is particularly advantageous because it combines a step necessary for manufacturing the component with a step specific to implementation of this invention. No additional steps are applied, because it is sufficient to simply adapt the extent of deposition of one of the layers forming the component.

According to one variant not shown, the titanium nitride layer forms the cathode of the component 2 that is then prolonged to extend on a metallic electrical track.

The case in which the titanium nitride layer is an intermediate layer of the component 2 could also be envisaged.

In these two variants, the titanium nitride layer is deposited on at least part of the electrical contact track and on an intermediate layer of the component.

Frequently used components such as OLEDs, used particularly for making micro-displays on a CMOS circuit, usually have a titanium nitride layer. An AlCu/TiN stack (aluminium copper alloy then titanium nitride) is also frequently used in the semiconductors field.

The invention is not limited to the embodiments described. In particular, many combinations of the embodiments described could be envisaged. It would also be possible to envisage other examples of layer thicknesses, other examples of metals forming the metal layer, other temperatures for ALD, other embodiments of the encapsulation cover. In all cases, the contact tracks will be covered by only the titanium nitride and the aluminium oxide stack.

The invention claimed is:

1. An electronic device, comprising:
at least one electronic component;
an atomic layer deposition aluminium oxide encapsulation layer disposed so as to cover the component; and
at least one electrical contact track connected to the component and composed of a metal layer,
wherein at least part of the electrical contact track is in direct physical contact with a layer of titanium nitride disposed so as to directly cover said electrical contact track, said layer of titanium nitride being in direct physical contact with said encapsulation layer so be directly covered by said encapsulation layer.

2. The device according to claim 1, wherein the encapsulation layer forms an external surface of the device.

3. The device according to claim 1, wherein the metal layer is an aluminium and copper alloy layer.

4. The device according to claim 1, wherein the metal layer is a copper layer or an aluminium layer or a chromium layer.

5. The device according to claim 1, wherein the encapsulation layer is between 20 nm and 200 nm thick.

6. The device according to claim 1, wherein the titanium nitride layer is between 5 nm and 250 nm thick.

7. The device according to claim 1, wherein the component is an inorganic solar cell, an OLED, an OPV, or a microelectronic components.

8. The device according to claim 1, further comprising an electrical contact element wired on the encapsulation layer, and arranged to carry a current to the electrical contact track.

* * * * *